(12) United States Patent
Dadheech et al.

(10) Patent No.: US 10,533,249 B2
(45) Date of Patent: *Jan. 14, 2020

(54) METHOD OF FORMING A SELF-CLEANING FILM SYSTEM

(71) Applicant: GM GLOBAL TECHNOLOGY OPERATIONS LLC, Detroit, MI (US)

(72) Inventors: Gayatri V. Dadheech, Bloomfield Hills, MI (US); Thomas A. Seder, Fraser, MI (US); James A. Carpenter, Rochester Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 288 days.

This patent is subject to a terminal disclaimer.

(21) Appl. No.: 15/598,849

(22) Filed: May 18, 2017

(65) Prior Publication Data

US 2018/0334742 A1    Nov. 22, 2018

(51) Int. Cl.
C23C 14/34    (2006.01)
C23C 14/35    (2006.01)
(Continued)

(52) U.S. Cl.
CPC ........... *C23C 14/352* (2013.01); *B01J 35/004* (2013.01); *C23C 14/0694* (2013.01); *C23C 14/083* (2013.01)

(58) Field of Classification Search
CPC ................................................ C23C 14/0694
See application file for complete search history.

(56) References Cited

U.S. PATENT DOCUMENTS 4,047,804 A    9/1977  Stephens
4,449,050 A    5/1984  Kamhi
(Continued)

FOREIGN PATENT DOCUMENTS

CN    108948889 A    12/2018
CN    108949031 A    12/2018
(Continued)

OTHER PUBLICATIONS

Science Mission Directorate, "Visible Light," NASA Science 2010, National Aeronautics and Space Administration; <http://science.nasa.gov/ems/09_visiblelight>.

*Primary Examiner* — Jason Berman
(74) *Attorney, Agent, or Firm* — Harness, Dickey & Pierce, P.L.C.

(57) ABSTRACT

A method of forming a self-cleaning film system includes depositing a fluorinated material selected from the group consisting of fluorinated organic compounds, fluorinated inorganic compounds, and combinations thereof onto a substrate to form a first layer. The method includes removing a plurality of portions of the first layer to define a plurality of cavities in the first layer and form a plurality of projections that protrude from the substrate. The method includes depositing a photocatalytic material onto the plurality of projections and into the plurality of cavities to form a second layer comprising: a plurality of bonded portions disposed in the plurality of cavities and in contact with the substrate, and a non-bonded portion disposed on the plurality of projections and spaced apart from the substrate. The method also includes, after depositing the photocatalytic material, removing the non-bonded portion to thereby form the self-cleaning film system.

15 Claims, 3 Drawing Sheets

(51) Int. Cl.
*B01J 35/00* (2006.01)
*C23C 14/08* (2006.01)
*C23C 14/06* (2006.01)

(56) References Cited

U.S. PATENT DOCUMENTS

| | | | |
|---|---|---|---|
| 4,536,179 A | 8/1985 | Anderson et al. | |
| 4,915,981 A | 4/1990 | Traskos et al. | |
| 6,101,266 A | 8/2000 | Laskowski et al. | |
| 6,406,158 B1 | 6/2002 | Ohkawa | |
| 6,797,974 B2 | 9/2004 | Philipp et al. | |
| 7,359,543 B2 | 4/2008 | Tsuji et al. | |
| 8,047,426 B2 | 11/2011 | Haycock et al. | |
| 9,044,574 B2 | 6/2015 | Yoshimachi | |
| 9,259,513 B2 | 2/2016 | Bedwell et al. | |
| 9,468,088 B2 | 10/2016 | Nah | |
| 9,861,974 B2 | 1/2018 | Dadheech et al. | |
| 10,052,622 B2 | 8/2018 | Dadheech et al. | |
| 10,195,602 B2 | 2/2019 | Dadheech et al. | |
| 10,274,647 B2 | 4/2019 | Seder et al. | |
| 2007/0237943 A1 | 10/2007 | Wakizaka et al. | |
| 2008/0053308 A1 | 3/2008 | Marzolin et al. | |
| 2009/0045617 A1 | 2/2009 | Lawandy et al. | |
| 2009/0130608 A1* | 5/2009 | Irving | G03F 7/0754 430/324 |
| 2009/0196791 A1 | 8/2009 | Ogata | |
| 2009/0267015 A1 | 10/2009 | Ogata | |
| 2010/0128965 A1 | 5/2010 | Blair | |
| 2011/0200656 A1 | 8/2011 | Olsson | |
| 2011/0220855 A1 | 9/2011 | Weir et al. | |
| 2013/0087374 A1 | 4/2013 | Nah | |
| 2014/0083473 A1 | 3/2014 | Lawandy | |
| 2015/0238644 A1 | 8/2015 | Sung et al. | |
| 2016/0107204 A1 | 4/2016 | Lawandy | |
| 2017/0056871 A1 | 3/2017 | Dadheech et al. | |
| 2018/0154345 A1 | 6/2018 | Dadheech et al. | |
| 2018/0318820 A1 | 11/2018 | Dadheech et al. | |
| 2018/0320023 A1 | 11/2018 | Dadheech et al. | |
| 2018/0333709 A1 | 11/2018 | Seder et al. | |
| 2018/0333710 A1 | 11/2018 | Dadheech et al. | |
| 2018/0333711 A1 | 11/2018 | Dadheech et al. | |
| 2018/0333756 A1 | 11/2018 | Seder et al. | |
| 2018/0335548 A1 | 11/2018 | Seder et al. | |
| 2018/0348509 A1 | 12/2018 | Carpenter et al. | |

FOREIGN PATENT DOCUMENTS

| | | |
|---|---|---|
| CN | 108949050 A | 12/2018 |
| CN | 108953597 A | 12/2018 |
| CN | 108953598 A | 12/2018 |
| CN | 108976873 A | 12/2018 |
| DE | 102018111826 A1 | 11/2018 |
| DE | 102018111827 A1 | 11/2018 |
| DE | 102018111828 A1 | 11/2018 |
| DE | 102018111830 A1 | 11/2018 |
| DE | 102018111831 A1 | 11/2018 |
| DE | 102018112987 A1 | 12/2018 |

* cited by examiner

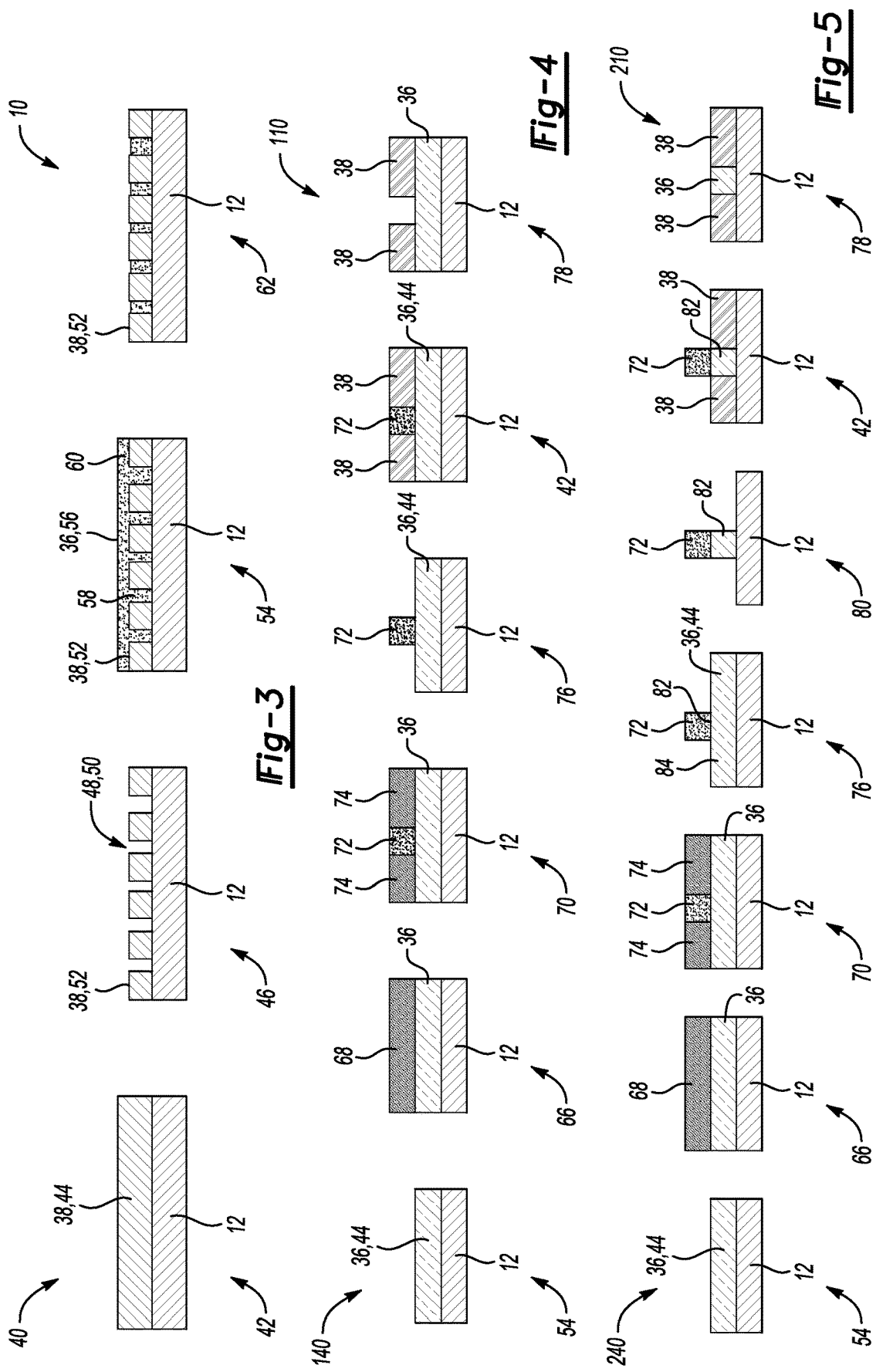

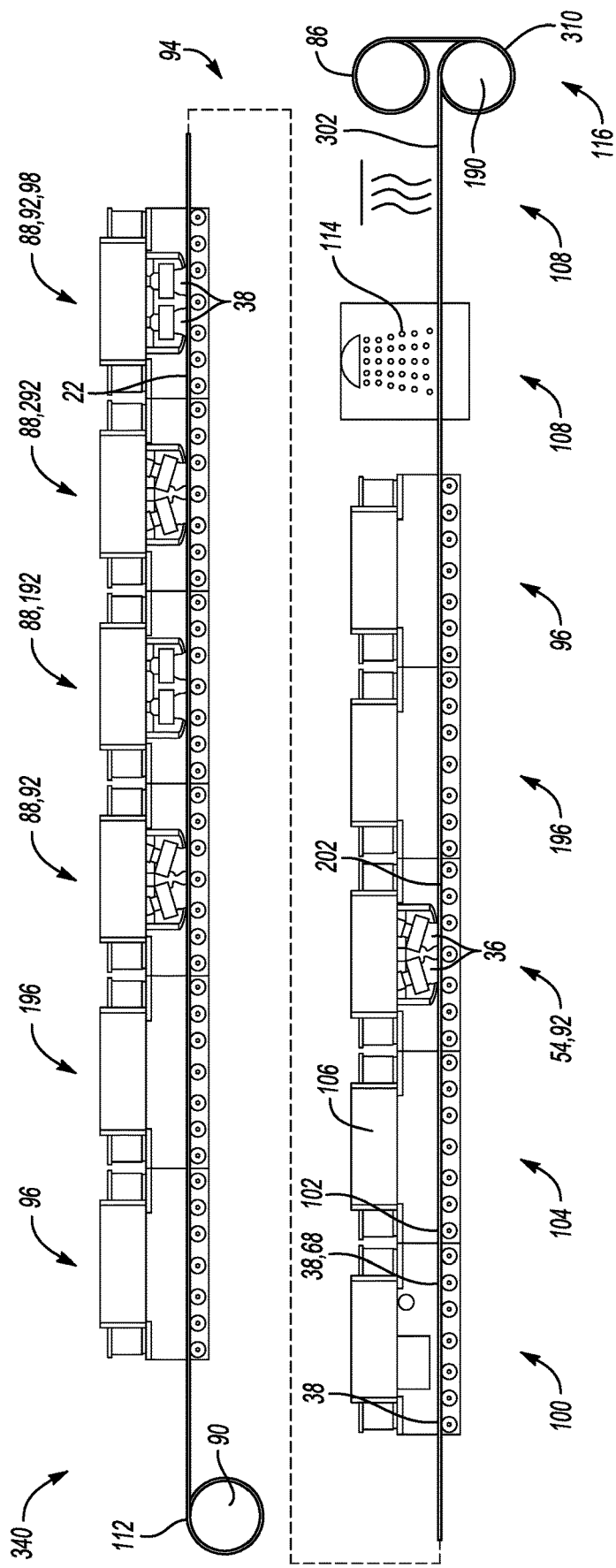

METHOD OF FORMING A SELF-CLEANING FILM SYSTEM

INTRODUCTION

The disclosure relates to a self-cleaning film system and to a method of forming the self-cleaning film system.

Devices, such as display systems, are often designed to be touched by an operator. For example, a vehicle may include a display system that presents information to an operator via a touchscreen. Similarly, an automated teller machine or kiosk may include a display system that is activated by touch.

Other devices, such as cameras and eyeglasses, generally include a lens surface which may be inadvertently touched by an operator during use. Further, other devices such as vehicles, windows, mirrors, appliances, cabinetry, furniture, cellular telephones, fingerprint scanners, sensors, copiers, medical instruments, and countertops may also include one or more surfaces which may be touched by an operator. Therefore, during use, an operator may deposit fingerprints and/or oils onto such devices and surfaces.

SUMMARY

A method of forming a self-cleaning film system includes depositing a fluorinated material selected from the group consisting of fluorinated organic compounds, fluorinated inorganic compounds, and combinations thereof onto a substrate to form a first layer. The method includes removing a plurality of portions of the first layer to define a plurality of cavities in the first layer and form a plurality of projections that protrude from the substrate. The method also includes depositing a photocatalytic material onto the plurality of projections and into the plurality of cavities to form a second layer. The second layer includes a plurality of bonded portions disposed in the plurality of cavities and in contact with the substrate, and a non-bonded portion disposed on the plurality of projections and spaced apart from the substrate. The method further includes, after depositing the photocatalytic material, removing the non-bonded portion to thereby form the self-cleaning film system. The self-cleaning film system includes a film disposed on the substrate and including the plurality of bonded portions disposed within the fluorinated material and spaced apart from one another such that the plurality of bonded portions abut, are surrounded by, and are not covered by the fluorinated material.

In one aspect, depositing the photocatalytic material may include chemically bonding the photocatalytic material to the substrate within the plurality of cavities.

The method may further include, after removing the non-bonded portion, removing the plurality of projections. In addition, the method may include, after removing the plurality of projections, redepositing the fluorinated material. Redepositing may include wiping the fluorinated material onto the substrate so that the fluorinated material contacts the plurality of bonded portions.

In another aspect, the method may further include contacting at least one of the plurality of bonded portions and squalene. The method may further include oxidizing the squalene. In addition, the method may include vaporizing the squalene.

In another embodiment, the method includes depositing a photocatalytic material onto a substrate to form a first layer, and disposing a photoresist onto the first layer. After disposing the photoresist, the method includes exposing the photoresist to light so that the photoresist has a developed portion and an undeveloped portion. The method also includes removing the undeveloped portion so that the developed portion protrudes from the first layer. After removing, the method includes depositing a fluorinated material selected from the group consisting of fluorinated organic compounds, fluorinated inorganic compounds, and combinations thereof onto the first layer to surround and contact the developed portion. After depositing the fluorinated material, the method includes removing the developed portion to thereby form the self-cleaning film system. The self-cleaning film system includes a film disposed on the substrate and including a plurality of bonded portions formed from the photocatalytic material, disposed within the fluorinated material, and spaced apart from one another such that the plurality of bonded portions abut, are surrounded by, and are not covered by the fluorinated material.

In one aspect, removing the undeveloped portion may include covering a protected portion of the first layer. Further, removing the undeveloped portion may include not coving an unprotected portion of the first layer. The method may also include, after removing the undeveloped portion, removing the unprotected portion. After removing the unprotected portion, the method may include depositing the fluorinated material onto the substrate to surround and contact the protected portion. Depositing the fluorinated material may include plasma-enhanced chemical vapor depositing fluorinated diamond-like carbon having an anatase form onto the substrate.

The method may further include, after depositing the fluorinated material, removing the developed portion. Removing the developed portion may include excimer laser annealing the developed portion and the fluorinated material. In another aspect, removing the developed portion may include ion beam annealing the developed portion and the fluorinated material.

In another embodiment, a method of forming a self-cleaning film system includes continuously depositing an anti-reflection film onto a substrate fed from a first roll. The method also includes depositing a fluorinated material selected from the group consisting of fluorinated organic compounds, fluorinated inorganic compounds, and combinations thereof onto the anti-reflection film. The method further includes ink jet printing a photoresist onto the fluorinated material to form a first precursor, and ion etching a first portion of the photoresist and the fluorinated material with a $SF_6$-$O_2$ plasma composition to form an exposed portion of the first precursor. In addition, the method includes depositing a photocatalytic material onto the exposed portion to form a second precursor, and dissolving a second portion of the photoresist to form a workpiece. Further, the method includes continuously rolling the workpiece onto a second roll to thereby form the self-cleaning film system.

In one aspect, continuously depositing the anti-reflection film may include magnetron sputtering a first sheet formed from titanium dioxide, magnetron sputtering a second sheet formed from silicon dioxide onto the first sheet, and magnetron sputtering a third sheet formed from titanium dioxide onto the second sheet.

Further, depositing the photocatalytic material may include depositing titanium dioxide having an anatase form.

The above features and advantages and other features and advantages of the present disclosure are readily apparent from the following detailed description of the best modes for carrying out the disclosure when taken in connection with the accompanying drawings.

BRIEF DESCRIPTION OF THE DRAWINGS

FIG. 3 is a schematic illustration of one embodiment of a method of forming the self-cleaning film system of FIGS. 1 and 2.

FIG. 4 is a schematic illustration of a second embodiment of a method of forming the self-cleaning film system of FIGS. 1 and 2.

FIG. 5 is a schematic illustration of a third embodiment of a method of forming the self-cleaning film system of FIGS. 1 and 2.

FIG. 6 is a schematic illustration of a fourth embodiment of a method of forming the self-cleaning film system of FIGS. 1 and 2.

DETAILED DESCRIPTION

Figure 1:
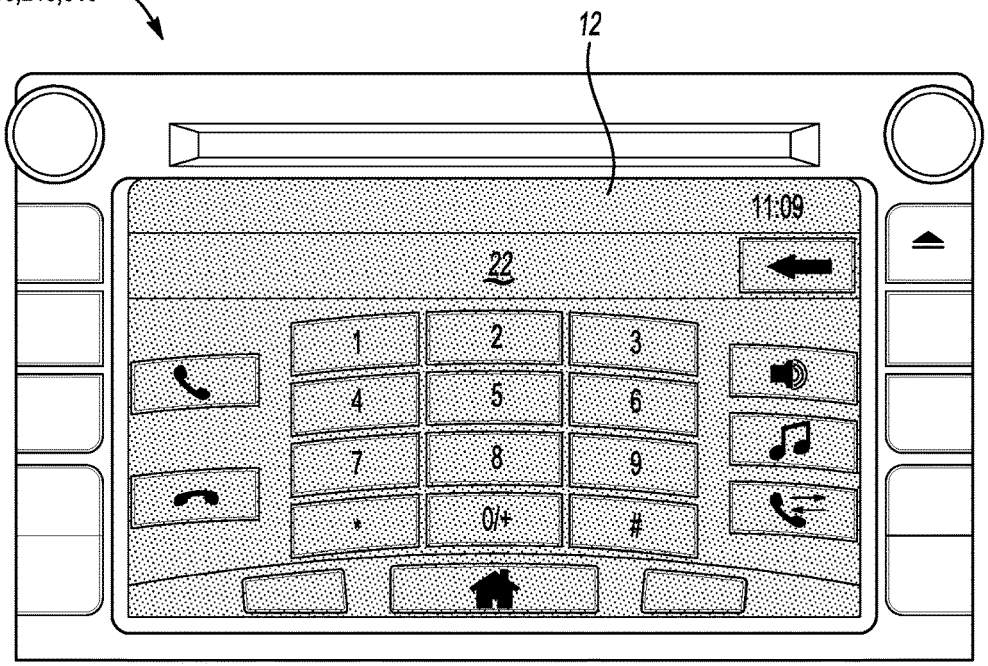
FIG. 1 is a schematic illustration of a front view of a self-cleaning film system.

Referring to the Figures, wherein like reference numerals refer to like elements, a self-cleaning film system 10, 110, 210, 310 is shown generally in FIG. 1. The self-cleaning film system 10, 110, 210, 310 may be suitable for applications in which an operator may touch and deposit fingerprints, oils, and/or other organic or carbon-based contaminants or pathogens onto a screen, lens, or surface. More specifically, the self-cleaning film system 10, 110, 210, 310 may be useful for applications requiring a clean, substantially oil- or fingerprint-free screen, lens, or surface. That is, the self-cleaning film system 10 may be useful for removing fingerprints and other organic contaminants from such screens, lenses, or surfaces.

For example, the self-cleaning film system 10, 110, 210, 310 may be useful for automotive applications such as in-dash navigation systems which include a touchscreen, vehicle cameras which include a lens, vehicle mirrors, and vehicle interior surfaces. Alternatively, the self-cleaning film system 10, 110, 210, 310 may be useful for non-automotive applications such as, but not limited to, consumer electronics, cellular telephones, eyewear, personal protective equipment, appliances, furniture, kiosks, fingerprint scanners, medical devices, sensors, aircraft, and industrial vehicles.

Figure 2:
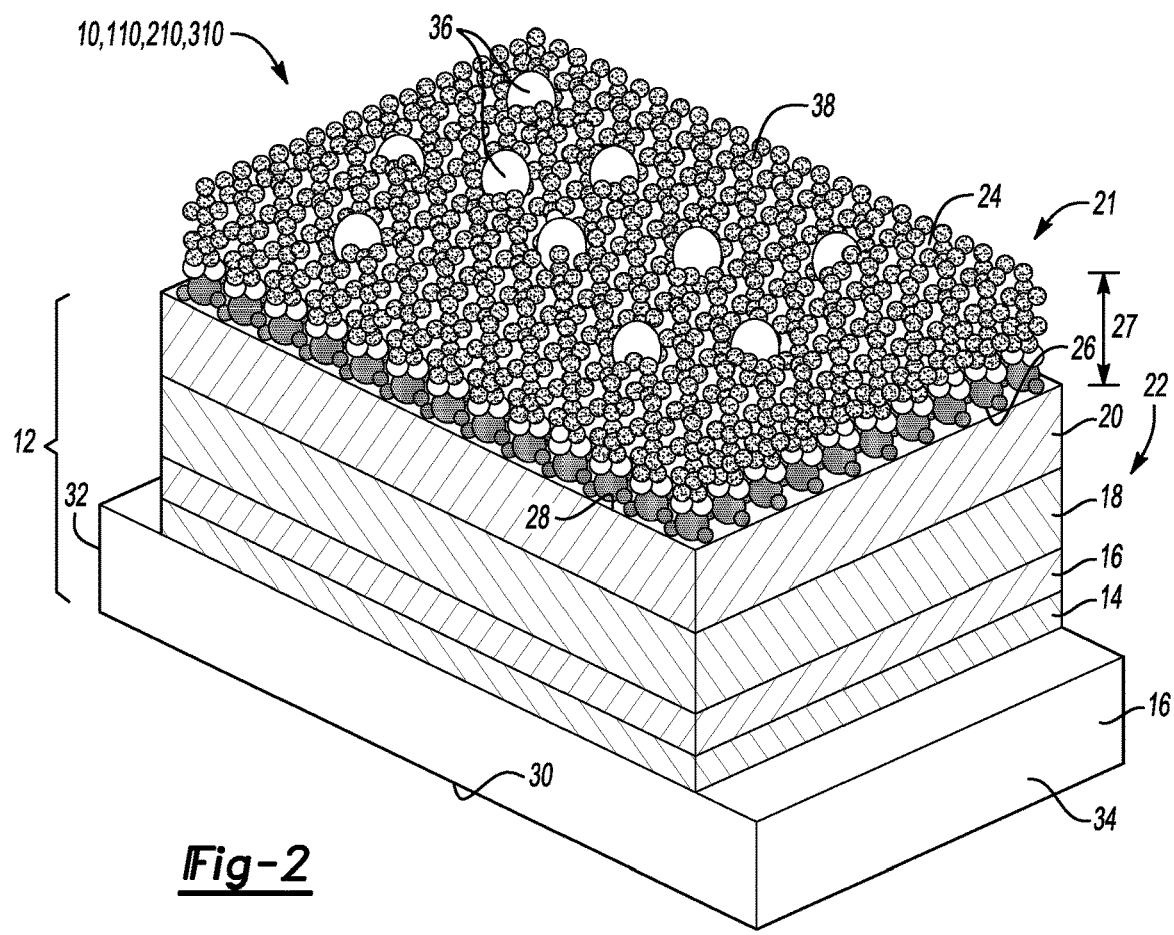
FIG. 2 is a schematic illustration of a magnified, perspective view of the self-cleaning film system of FIG. 1.

Referring now to FIG. 2, the self-cleaning film system 10, 110, 210, 310 may be applied to a substrate 12. The substrate 12 may be formed from a vitreous, transparent material suitable for refracting visible light. For example, in one embodiment, the substrate 12 may be formed from silicon dioxide. In another example, the substrate 12 may be formed from a polycarbonate or other plastic. Alternatively, as best shown in FIG. 2, the substrate 12 may be formed from an anti-reflective film comprising alternating layers or sheets 14, 16, 18, 20 of silicon dioxide and titanium dioxide. That is, the substrate 12 may be an anti-reflective film. Each of the alternating sheets 14, 16, 18, 20 of silicon dioxide and titanium dioxide may have a thickness of from 5 nm to 125 nm. For example, the substrate 12 may include a first sheet 14 formed from titanium dioxide and having a thickness of 10 nm. The substrate 12 may include a second sheet 16 formed from silicon dioxide and having a thickness of 33 nm. The substrate 12 may include a third sheet 18 formed from titanium dioxide and having a thickness of 100 nm. The substrate 12 may have a fourth sheet 20 formed from silicon dioxide and having a thickness of 75 nm. In general, the substrate 12 may be configured as, by way of non-limiting examples, a screen of a display system, a lens of eyeglasses or goggles, a visor of a helmet, a surface of a refrigerator, a face of a cabinet, a door panel of a vehicle, a touchscreen of a kiosk, or as another surface or device that may be touched by an operator.

The self-cleaning film system 10, 110, 210, 310 also includes a film 21 disposed on the substrate 12, e.g., chemically bonded to the substrate 12 as set forth in more detail below. The film 21 may be configured to cover and protect the substrate 12 from fingerprints, oils, and organic contaminants. That is, the film 21 may be configured to cause fingerprints, oils, and organic contaminants deposited on the film 21 to vanish, disappear, or vaporize so as to maintain a clean substrate 12 that is capable of displaying crisp images or reflections.

More specifically, as described with reference to FIG. 2, the film 21 may have a first surface 24 and a second surface 26 spaced opposite the first surface 24. The second surface 26 may abut the substrate 12, and the first surface 24 may be substantially free from squalene, organic material, and/or other oils of fatty acids. As used herein, the terminology squalene refers to an organic compound having 30 carbon atoms and represented by the International Union of Pure and Applied Chemistry name (6E,10E,14E,18E)-2,6,10,15, 19,23-hexamethyltetracosa-2,6,10,14,18,22-hexaene. In general, the film 21 may be characterized as a thin film and may have a thickness 27 of, for example, from 0.01 µm to 150 µm. For example, the film 21 may have a thickness 27 of 0.025 µm.

The substrate 12 also has a proximal surface 28 abutting the second surface 26 and a distal surface 30 spaced opposite the proximal surface 28. Therefore, the substrate 12 and the film 21 are configured to transmit visible light through the proximal surface 28, the distal surface 30, the first surface 24, and the second surface 26. The substrate 12 also has a first edge 32 connecting the proximal surface 28 and the distal surface 30, and a second edge 34 spaced opposite the first edge 32.

The film 21 may define a contact angle with water of greater than or equal to 115°, e.g., greater than 140°. That is, the contact angle defined between an edge of a droplet of water and the first surface 24 may be greater than or equal to 115°. For example, the film 21 may define a contact angle with water of greater than or equal to 150°. As such, water, oils, and contaminants may effectively bead on and translate across the first surface 24. Stated differently, water, oils, and contaminants may be mobile and effectively translate along the first surface 24 and the first surface 24 may not be wettable.

Although not shown, the self-cleaning film system 10, 110, 210, 310 may further include a light source disposed adjacent the first edge 32 and configured for emitting electromagnetic radiation. For example, the light source may be an ultraviolet light-emitting diode and the electromagnetic radiation may have a wavelength of from 400 nm to 100 nm. Alternatively, the light source may be an incandescent bulb or a visible light-emitting diode and the electromagnetic radiation may have a wavelength of from 740 nm to 380 nm.

Referring again to FIG. 2, the film 21 is formed from a self-cleaning film composition. That is, the film 21 may mitigate fingerprint and oil deposition, i.e., self-clean. The self-cleaning film composition includes a photocatalytic material 36 (FIGS. 3-5) and a fluorinated material 38 (FIGS. 3-5), as set forth in more detail below.

The photocatalytic material 36 may provide the film 21 with self-cleaning capability. That is, the photocatalytic material 36 may oxidize and/or vaporize organic material, e.g., squalene, present on the first surface 24 of the film 21, as set forth in more detail below. In particular, the photocatalytic material 36 may be a light-activated photocatalyst upon exposure to, for example, visible or ultraviolet light.

Suitable photocatalytic materials 36 may include, but are not limited to, photo-oxidative semiconductors, semiconducting oxides, doped metal oxides, heterojunction materials, and combinations thereof.

In one embodiment, the photocatalytic material 36 may be titanium dioxide and may be present in a rutile form. Alternatively, the photocatalytic material 36 may be titanium dioxide and may be present in an anatase form, which may exhibit a comparatively higher photocatalytic activity than the rutile form. In other embodiments, the photocatalytic material 36 may be titanium dioxide and may be present as a combination of the rutile form and the anatase form. Further, the photocatalytic material 36 may be doped to form a functionalized photocatalytic material, e.g., functionalized titanium dioxide. For example, the functionalized photocatalytic material may be doped with a metal such as, but not limited to, silver, chromium, cobalt, copper, vanadium, iron, platinum, molybdenum, lanthanum, niobium, and combinations thereof Alternatively, the functionalized photocatalytic material may be doped with a non-metal such as, but not limited to, nitrogen, sulfur, carbon, boron, potassium, iodine, fluorine, and combinations thereof.

The photocatalytic material 36 may be characterized as a nanoparticle and may have an average diameter measureable on a nanometer scale. Alternatively, the photocatalytic material 36 may be characterized as a particle and may have an average diameter measureable on a micrometer scale. Generally, the photocatalytic material 36 may be present in the self-cleaning film composition or film 21 in an amount of from about 2 parts by volume to about 35 parts by volume based on 100 parts by volume of the film 21.

In other non-limiting embodiments, the photocatalytic material 36 may include a semiconducting oxide such as, but not limited to, zinc oxide, bismuth, tin oxide, and combinations thereof. The semiconducting oxide may be selected to have a band gap separation suitable for a photocatalytic reaction, as set forth in more detail below.

Referring now to FIG. 2, the self-cleaning film composition and film 21 include the fluorinated material 38. The fluorinated material 38 is selected from the group consisting of fluorinated organic compounds, fluorinated inorganic compounds, and combinations thereof. As best shown in FIG. 2, the fluorinated material 38 may form a majority of the film 21 and may be characterized as a monolayer field. As used herein, the terminology monolayer refers to a layer having a thickness 27 of one molecule. That is, the monolayer may be one molecule thick and may be characterized as a thin layer. In one embodiment, the fluorinated material 38 is fluorinated diamond-like carbon. In another embodiment, the fluorinated material 38 is fluorinated tin (IV) oxide.

Referring now to FIG. 3, a method 40 of forming the self-cleaning film system 10 includes depositing 42 the fluorinated material 38 selected from the group consisting of fluorinated organic compounds, fluorinated inorganic compounds, and combinations thereof onto the substrate 12 to form a first layer 44. The fluorinated material 38 may be deposited or coated onto the substrate 12 in a suitable manner. By way of non-limiting examples, depositing 42 may include chemical vapor depositing (CVD), physical vapor depositing (PVD), atomic layer depositing (ALD), dipping, wiping, spraying, meniscus filming, wet filming, combinations thereof, and the like. Depositing 42 may include forming a self-aligned monolayer that is physically adsorbed, i.e., physisorbed, and cross-linked with neighboring molecules.

The method 40 also includes removing 46 a plurality of portions 48 of the first layer 44 to define a plurality of cavities 50 in the first layer 44 and form a plurality of projections 52 that protrude from the substrate 12. The plurality of portions 48 may be removed by a suitable manner. By way of non-limiting examples, removing 46 may include ultraviolet photoablating through an optical mask or plasma etching through a fine metal mask. For example, removing 46 may include projecting plasma or ions at the first layer 44 through a mask to thereby etch away the plurality of portions 48, define the plurality of cavities 50, and form the plurality of projections 52.

The method 40 also includes depositing 54 the photocatalytic material 36 onto the plurality of projections 52 and into the plurality of cavities 50 to form a second layer 56. Depositing 54 may include chemically bonding the photocatalytic material 36 to the substrate 12 within the plurality of cavities 50. The photocatalytic material 36 may be deposited onto the plurality of projections 52 in a suitable manner. For example, the photocatalytic material 36, such as titanium dioxide, may be deposited onto the plurality of projections 52 and into the plurality of cavities 50 via magnetron sputtering. The magnetron sputtering, for example, may be reactive using a titanium metal target or may be direct deposition from a ceramic titanium dioxide target.

Referring again to FIG. 3, the second layer 56 has a plurality of bonded portions 58 disposed in the plurality of cavities 50 and in contact with the substrate 12, and a non-bonded portion 60 disposed on the plurality of projections 52 and spaced apart from the substrate 12. That is, nucleation of the photocatalytic material 36 and substrate-bonding and growth may be efficient in high-surface energy areas, i.e., the plurality of cavities 50 or areas without the fluorinated material 38 present, to form the plurality of bonded portions 58, and inefficient in low-surface energy areas, i.e., the plurality of projections 52 or non-bonded portions 60 or areas which include the fluorinated material 38 projecting from the substrate 12, to form the non-bonded portion 60.

The method 40 also includes, after depositing 54 the photocatalytic material 36, removing 62 the non-bonded portion 60 to thereby form the self-cleaning film system 10. The non-bonded portion 60 may be removed in a suitable manner. By way of non-limiting examples, removing 62 may include washing or wiping away the non-bonded portion 60. As such, the self-cleaning film system 10 includes the film 21 (FIG. 2) disposed on the substrate 12 and including the plurality of bonded portions 58 disposed within the fluorinated material 38 and spaced apart from one another such that the plurality of bonded portions 58 abut, are surrounded by, and are not covered by the fluorinated material 38. The self-cleaning film system 10 may have excellent durability due to the fluorinated material 38, e.g., the fluorinated diamond-like carbon, and the photocatalytic material 36, e.g., the titanium dioxide present in the anatase form, disposed within the fluorinated material 38. That is, even after use, the fluorinated material 38 may still be present.

Alternatively, although not shown, the method 40 may further include, after removing 62 the non-bonded portion 60, removing the plurality of projections 52. For example, the plurality of projections 52 may be removed during use due to use or wear of the self-cleaning film system 10.

However, after removing the plurality of projections 52, the method 40 may include redepositing the fluorinated material 38. The fluorinated material 38 may be redeposited in a suitable manner. By way of non-limiting examples, redepositing may include wiping the fluorinated material 38 onto the substrate 12 so that the fluorinated material 38 contacts the plurality of bonded portions 58.

The method 40 may further include contacting at least one of the plurality of bonded portions 58 and squalene. That is, contacting may include touching at least one of the plurality of bonded portions 58 such that an operator deposits fingerprints, squalene, organic matter, and/or oils onto the first surface 24 (FIG. 2). Oils may include oils of fatty acids and may be synthesized naturally and applied to the at least one of the plurality of bonded portions 58 as the operator touches the at least one of the plurality of bonded portions 58, or may be applied to the at least one of the plurality of bonded portions 58 artificially such as by spraying.

Contact between the squalene, the photocatalytic material 36 which is exposed to electromagnetic radiation emitted by a light source having a wavelength of less than 357 nm, and water may initiate formation of radicals. The radicals may then react with hydrocarbon debris. More specifically, the photocatalytic material 36 may be a photocatalyst such as titanium dioxide. A photocatalytic reaction may create a strong oxidation agent and breakdown the organic matter, e.g., squalene, to low chain hydrocarbon to carbon dioxide and water in the presence of the photocatalyst, i.e., the photocatalytic material 36; electromagnetic radiation, e.g., ultraviolet light; and water, e.g., humidity from ambient conditions. As such, the photocatalytic material 36 may not be consumed by the catalytic reaction, but may instead solely accelerate the photocatalytic reaction as a non-reactant.

In greater detail, when electromagnetic radiation having a desired wavelength illuminates the photocatalytic material 36, an electron from the valence band of the photocatalytic material 36 may promote to the conduction band of the photocatalytic material 36, which in turn may create a hole in the valence band and an excess of negative charge or electron in the conduction band. The hole may assist oxidation and the electron may assist reduction. Generally, the hole may combine with water to produce a hydroxyl radical (.OH). The hole may also react directly with squalene or other organic material to increase an overall self-cleaning efficiency of the self-cleaning film system 10. Similarly, oxygen in the ambient environment surrounding the photocatalytic material 36 may be reduced by the electron to form a superoxide ion ($.O_2-$), which in turn may oxidize the organic material present on the self-cleaning film system 10. Therefore, the method 40 may include oxidizing the squalene as well as other hydrocarbons.

In addition, the hole may become trapped before recombination with the electron. For such situations, the photocatalytic material 36 may be functionalized. For example, the method may include doping titanium dioxide with, for example, palladium or ruthenium. The palladium or ruthenium may act as an electrocatalyst and may increase a transfer of electrons to oxygen molecules, which may in turn lower the occurrence of the recombination of electrons and holes.

Further, organic material that is present on the fluorinated material 38 rather than in direct contact with the photocatalytic material 36 may be in dynamic equilibrium with the first surface 24 (FIG. 2) and may diffuse toward a comparatively higher-energy location on the film 21, i.e., the photocatalytic material 36. Therefore, the method 40 may also include diffusing the squalene along the film 21 from the fluorinated material 38 to the photocatalytic material 36. To improve such diffusion, the light source may be tuned to emit electromagnetic radiation having a wavelength that is tuned to a vibration resonance of the squalene and the fluorinated material 38. Such tuning may enable the squalene or fingerprint to wiggle or translate along the fluorinated material 38 to the photocatalytic material 36 where the squalene may undergo the photocatalytic reaction described above. Alternatively or additionally, the film 21 may also be heated, for example by infrared radiation, to further improve diffusion across the fluorinated material 38 towards the photocatalytic material 36.

As such, the method 40 may further include vaporizing the squalene. More specifically, once the squalene contacts the photocatalytic material 36, the squalene may be photolyzed into comparatively low vapor pressure-sized pieces or parts, which may vaporize off the film 21 and thereby remove the fingerprint or squalene from the film 21. Therefore, the self-cleaning film system 10 may be characterized as self-cleaning. That is, the film 21 may protect the substrate 12 by removing, e.g., oxidizing and vaporizing the fingerprints, squalene, oils, and/or organic material deposited by the touch of an operator. Consequently, the self-cleaning film system 10 and method 40 may provide excellent aesthetics, cleanliness, and readability for display systems, lenses, sensors, and surfaces.

Advantageously, the method 40 produces minimal waste and includes few processes. Further, although the self-cleaning film system 10 may be durable such that the plurality of bonded portions 58 of the photocatalytic material 36 and the fluorinated material 38 may be substantially permanently attached the substrate 12, the fluorinated material 38 may alternatively be reapplied after wear.

Referring now to FIG. 4, in a second embodiment, the method 140 of forming a self-cleaning film system 110 includes depositing 54 the photocatalytic material 36 onto the substrate 12 to form the first layer 44. The photocatalytic material 36 may be deposited onto the substrate 12 in a suitable manner. By way of non-limiting examples, depositing 54 may include atomic layer depositing (ALD), magnetron sputtering, electron beam evaporating, chemical vapor depositing (CVD), and the like. The magnetron sputtering, for example, may be reactive using a titanium metal target or may include direct deposition from a ceramic titanium dioxide target.

The method 140 further includes disposing 66 a photoresist 68 onto the first layer 44. The terminology photoresist 68 refers to a photosensitive resist that, when exposed to light, loses a resistance or susceptibility to attack by an etchant or solvent. Therefore, the photoresist 68 may be useful for forming a pattern on the first layer 44. The photoresist 68 may be characterized as positive or negative. For example, the method 140 may include disposing 66 a positive photoresist 68 onto the substrate 12 to transfer a predetermined pattern onto the substrate 12.

After disposing 66 the photoresist 68, the method 140 also includes exposing 70 the photoresist 68 to light, e.g., visible light or ultraviolet light via an optical mask or photomask, so that the photoresist 68 has a developed portion 72 and an undeveloped portion 74. That is, exposing 70 may include a photolithographic process and may develop the photoresist 68 to transfer a desired pattern onto the first layer 44. For example, exposing 70 may include forming the developed portion 72 and the undeveloped portion 74 according to a desired pattern, size, and density of the photocatalytic material 36 for the finished self-cleaning film system 110.

As described with continued reference to FIG. 4, the method 140 also includes removing 76 the undeveloped portion 74 so that the developed portion 72 protrudes from the first layer 44. The undeveloped portion 74 may be removed in a suitable manner. By way of non-limiting examples, removing 76 may include wiping the undeveloped portion 74 with a solvent that is reactive with the photoresist 68.

After removing 76, the method 140 includes depositing 42 the fluorinated material 38 selected from the group consisting of fluorinated organic compounds, fluorinated inorganic compounds, and combinations thereof onto the first layer 44 to surround and contact the developed portion 72. For example, the method 140 may include depositing 42 fluorinated diamond-like carbon onto the first layer 44. Alternatively, the method 140 may include depositing 42 fluorinated tin (IV) oxide onto the first layer 44. The fluorinated material 38 may be deposited or coated onto the first layer 44 in a suitable manner. By way of non-limiting examples, depositing 42 may include chemical vapor depositing (CVD), atomic layer depositing (ALD), dipping, wiping, spraying, meniscus filming, wet filming, combinations thereof, and the like. Depositing 42 may include forming a self-aligned monolayer that is physically adsorbed, i.e., physisorbed, and cross-linked with neighboring molecules.

After depositing 42 the fluorinated material 38, the method 140 includes removing 78 the developed portion 72 to thereby form the self-cleaning film system 110. The developed portion 72 may be removed in a suitable manner. By way of non-limiting examples, removing 78 may include wiping or washing the developed portion 72. For example, removing 78 may include wiping the developed portion 72 with a suitable solvent that is reactive with the photoresist 68. As such, the self-cleaning film system 110 includes the film 21 (FIG. 2) disposed on the substrate 12 and including the plurality of bonded portions 58 (FIG. 2) formed from the photocatalytic material 36, disposed within the fluorinated material 38, and spaced apart from one another such that the plurality of bonded portions 58 abut, are surrounded by, and are not covered by the fluorinated material 38. For the method 140, the self-cleaning film system 110 may have a comparatively high reflectivity.

Referring to FIG. 5, in a third embodiment, a method 240 of forming the self-cleaning film system 210 includes depositing 54 the photocatalytic material 36 onto the substrate 12 to form the first layer 44, as set forth above. In one embodiment, the first layer 44 is formed from titanium dioxide present in an anatase form. In another embodiment, the first layer 44 is formed from titanium dioxide present in a brookite form. The method 240 further includes disposing 66 the photoresist 68 onto the first layer 44, as also set forth above. After disposing 66 the photoresist 68, the method 240 also includes exposing 70 the photoresist 68 to light, e.g., visible light or ultraviolet light via an optical mask or photomask, so that the photoresist 68 has the developed portion 72 and the undeveloped portion 74, as further set forth above.

The method 240 also includes removing 76 the undeveloped portion 74 so that the developed portion 72 protrudes from the first layer 44. Removing the undeveloped portion 74 may include covering a protected portion 82 of the first layer 44. Further, removing the undeveloped portion 74 may include not covering an unprotected portion 84 of the first layer 44. The undeveloped portion 74 may be removed in a suitable manner. By way of non-limiting examples, removing 76 may include wiping the undeveloped portion 74 with a solvent that is reactive with the photoresist 68.

After removing 76 the undeveloped portion 74, the method 240 may include removing 80 the unprotected portion 84. For example, removing 80 may include acid etching away the unprotected portion 84 of the photocatalytic material 36 so that the protected portion 82 remains and projects from the substrate 12.

After removing 80 the unprotected portion 84, the method 240 includes depositing 42 the fluorinated material 38 onto the substrate 12 to surround and contact the protected portion 82. The fluorinated material 38 may be deposited or coated onto the substrate 12 in a suitable manner. By way of non-limiting examples, depositing 42 may include chemical vapor depositing (CVD), atomic layer depositing (ALD), physical vapor depositing (PVD), dipping, wiping, spraying, meniscus filming, wet filming, combinations thereof, and the like. Depositing 42 may include forming a self-aligned monolayer that is physically adsorbed, i.e., physisorbed, and cross-linked with neighboring molecules. That is, depositing 42 may include chemically bonding the photocatalytic material 36 to the substrate 12 to surround and abut the protected portion 82.

In one example, depositing 42 the fluorinated material 38 may include converting the photocatalytic material 36, e.g., titanium dioxide, present in the brookite form to the photocatalytic material 36 present in the anatase form. That is, depositing 42 may include converting the brookite form to the anatase form by adding energy to the photocatalytic material 36 while depositing 42. In one embodiment, depositing 42 the fluorinated material 38 may include plasma-enhanced chemical vapor depositing fluorinated diamond-like carbon having an anatase form onto the substrate 12. The plasma-enhanced chemical vapor depositing 42 may add energy and convert the brookite form to the anatase form.

After depositing 42 the fluorinated material 38, the method 240 may include removing 78 the developed portion 72 to thereby form the self-cleaning film system 210. The developed portion 72 may be removed in a suitable manner. By way of non-limiting examples, removing 78 may include wiping, washing, excimer laser annealing, and ion beam annealing the developed portion 72.

For example, removing 78 may include wiping the developed portion 72 with a suitable solvent that is reactive with the photoresist 68. In another embodiment, removing 78 the developed portion 72 may include excimer laser annealing the developed portion 72 and the fluorinated material 38. That is, the method 240 may include depositing 42 the fluorinated diamond-like carbon, removing the photoresist 68, and subsequently high-energy excimer laser annealing the developed portion 72 and the fluorinated diamond-like carbon to thereby convert photocatalytic material 36 present in the brookite form to the photocatalytic material 36 present in the anatase form.

In yet another embodiment, removing 78 the developed portion 72 may include ion beam annealing the developed portion 72 and the fluorinated material 38. That is, the method 240 may include depositing 42 the fluorinated diamond-like carbon, removing the photoresist 68, and subsequently high-energy ion beam annealing the developed portion 72 and the fluorinated diamond-like carbon to thereby convert photocatalytic material 36 present in the brookite form to the photocatalytic material 36 present in the anatase form. For the method 240, the self-cleaning film system 210 may have a comparatively lower reflectivity because the photocatalytic material 36 may not spoil a reflectance of the self-cleaning film system 210.

Referring now to FIG. 6, in a fourth embodiment, the method 340 of forming the self-cleaning film system 310 includes producing the self-cleaning film system 310 in a continuous roll-to-roll process rather than in a batch process. That is, the method 340 may include growing each layer 14, 16, 18, 20 (FIG. 2) sequentially in-line using the continuous roll-to-roll process as set forth in more detail below. The method 340 of forming the self-cleaning film system 310 having an integrated self-cleaning film 21 and anti-reflection film 22 has comparatively low tack time per layer 14, 16, 18, 20; has comparatively low tack time per square meter of the integrated self-cleaning film 21 and anti-reflection film 22; includes a comparatively cost-effective substrate 12; and provides a finished product, i.e., the self-cleaning film system 310, that may be separately laminated onto a surface.

That is, the self-cleaning film system 310 may be an adhesive sheet or composite that is separately adherable to a touchable surface. The self-cleaning film system 310 may be manufactured separately from, and then subsequently attached to, the touchable surface to protect the touchable surface from organic contaminants such as squalene. Further, the self-cleaning film system 310 may be removable from and repositionable on the touchable surface. As such, in this embodiment, the self-cleaning film system 310 may include a release liner 86 and the self-cleaning film system 310 may be provided as an adhesive sheet. The release liner 86 may be formed from a paper, such as Kraft paper or machine glazed paper, or a plastic, such as polyethylene terephthalate or polypropylene. The self-cleaning film system 310 may therefore be applied to a touchable surface, such as, but not limited to, windows, cabinetry, appliances, displays, writing utensils, eyeglasses, visors, telephones, toilets, drinking fountains, mirrors, steering wheels, door handles, shift knobs, hoods, decklids, surgical utensils, hygienic surfaces, and the like.

As described with reference to FIG. 6, the method 340 includes continuously depositing 88 the anti-reflection film 22 (FIG. 2) onto a substrate 112 fed from a first roll 90. That is, the substrate 112 may be fed from the first roll 90, i.e., a feeder roll, that may continuously unwind as the anti-reflection film 22 is continuously deposited onto the substrate 112. The substrate 112 may be formed from a suitable material according to the desired end application of the self-cleaning film system 310. For example, the substrate 112 may be formed from a transparent, comparatively thin, flexible plastic film such as cellulose triacetate or polyethylene terephthalate.

More specifically, continuously depositing 88 the anti-reflection film 22 may include magnetron sputtering 92 a first sheet 14 (FIG. 2) formed from titanium dioxide, magnetron sputtering 192 a second sheet 16 (FIG. 2) formed from silicon dioxide onto the first sheet 14, and magnetron sputtering 292 a third sheet 18 (FIG. 2) formed from titanium dioxide onto the second sheet 16. Magnetron sputtering 92 may include depositing the first, second, and third sheets 14, 16, 18 using rotary or planar targets. Continuously depositing 88 the anti-reflection film 22 may form alternating sheets 14, 16, 18, 20 as shown in FIG. 2 and may occur under vacuum on a coating line 94 that may include, for example, a rotating mechanical pump (not shown), a diffusion pump (not shown), and a cold trap (not shown).

The method 340 may further include, prior to continuously depositing 88, drawing 96 a rough vacuum on the substrate 112 and drawing 196 a high vacuum on the substrate 112. That is, drawing 96 the rough vacuum may include preparing the substrate 112 at an atmospheric pressure of from 100 kPa to 3 kPa such that bulk air and gases are swept from the coating line 94. Drawing 196 the high vacuum may include preparing the substrate 112 at an atmospheric pressure of from 100 mPa to 100 nPa such that gas molecules are swept from the coating line 94.

After continuously depositing 88, the method 340 includes disposing 98 the fluorinated material 38 selected from the group consisting of fluorinated organic compounds, fluorinated inorganic compounds, and combinations thereof onto the anti-reflection film 22. For example, the method 340 may include disposing 98 fluorinated diamond-like carbon onto the anti-reflection film 22. Alternatively, the method 340 may include disposing 98 fluorinated tin (IV) oxide onto the anti-reflection film 22. The fluorinated material 38 may be disposed or deposited or coated onto the anti-reflection film 22 in a suitable manner. In one non-limiting embodiment, disposing 98 may include magnetron sputtering 92 the fluorinated material 38 onto the anti-reflection film 22. The magnetron sputtering 92 may be reactive using a planar target or a rotary target.

The method 340 further includes ink jet printing 100 the photoresist 68 onto the fluorinated material 38 to form a first precursor 102. Ink jet printing 100 may include covering or masking with the photoresist 68 an area of the fluorinated material 38, e.g., fluorinated diamond-like carbon, to be present in the finished product, i.e., the self-cleaning film system 310. Ink jet printing 100 may include creating a pattern on the first precursor 102 of covered areas of the fluorinated material 38, i.e., areas of the fluorinated material 38 that will not be removed during subsequent processing.

With continued reference to FIG. 6, the method 340 also includes ion etching 104 a first portion of the photoresist 68 and the fluorinated material 38 with a $SF_6$-$O_2$ plasma composition 106 to form an exposed portion of the first precursor 102. That is, the method 340 includes reactive ion etching 104 the first portion with fluorine atoms and oxygen atoms to remove unwanted fluorinated material 38 and a part of the photoresist 68. As set forth above, the desired areas of the fluorinated material 38 covered during ink jet printing 100 may not be etched from the first precursor 102.

Next, the method 340 includes depositing 54 the photocatalytic material 36 onto the exposed portion to form a second precursor 202. In particular, the method 340 may include depositing 54 titanium dioxide having the anatase form onto the exposed portion. By way of non-limiting examples, depositing 54 may include magnetron sputtering 92, chemical vapor depositing (CVD), atomic layer depositing (ALD), physical vapor depositing (PVD), dipping, wiping, spraying, meniscus filming, wet filming, combinations thereof, and the like.

The method 340 may further include drawing 196 a high vacuum on the second precursor 202 and drawing 96 a rough vacuum on the second precursor 202 to prepare the second precursor 202 for eventual rewinding onto a second roll 190, i.e., a finished product roll. Drawing 196 the high vacuum may include conditioning the second precursor 202 at an atmospheric pressure of from 100 mPa to 100 nPa such that gas molecules are swept into the coating line 94. Further, drawing 96 the rough vacuum may include conditioning the second precursor 202 at an atmospheric pressure of from 100 kPa to 3 kPa such that bulk air and gases are swept into the coating line 94.

In addition, the method 340 includes dissolving 108 a second portion of the photoresist 68 to form a workpiece 302. For example, dissolving 108 may include washing the second precursor 202 and drying the second precursor 202 to remove the photoresist 68. More specifically, the method 340 may include washing the second precursor 202 with a solvent 114 such as acetone and drying the second precursor 202 to evaporate the solvent 114 and form the workpiece 302.

Although not shown, the method 40, 140, 240, 340 may also include forming a texture on the first surface 24 (FIG. 2). For example, the first surface 24 may have a texture defined by a plurality of microstructures spaced apart from one another along the monolayer and a plurality of nanostructures disposed on each of the plurality of microstructures. Further, each of the plurality of microstructures may have a conical shape and a first height of from 0.5 µm to 2 µm, e.g., 1 µm, and each of the plurality of nanostructures may have a second height of from 1 nm to 4 nm, e.g., 2 nm. The texture defined by the combination of the plurality of microstructures and the plurality of nanostructures may form a cauliflower-like or raspberry-like, non-smooth first surface 24. The plurality of nanostructures disposed on the plurality of microstructures may form a hierarchical, stochastic structure or texture that contributes to the self-cleaning capabilities of the self-cleaning film 21. The plurality of microstructures and the plurality of nanostructures together may increase the contact angle with water and oils such that the self-cleaning film 21 exhibits excellent soil-resistance and minimal wettability.

Further, the method 340 includes continuously rolling 116 the workpiece 302 onto the second roll 190 to thereby form the self-cleaning film system 10. That is, the method 340 may include rewinding the workpiece 302 onto the finished product or second roll 190 such that the self-cleaning film system 310 is continuously produced. As such, the method 340 is simple and cost-effective. Prior to continuously rolling 116, the method 340 may also include affixing the release liner 86 to the workpiece 302 so that self-cleaning film system 310 may therefore be applied to a touchable surface, such as, but not limited to, windows, cabinetry, appliances, displays, writing utensils, eyeglasses, visors, telephones, toilets, drinking fountains, mirrors, steering wheels, door handles, shift knobs, hoods, decklids, surgical utensils, hygienic surfaces, and the like. Therefore, the method 340 is efficient, cost-effective, and capable of comparatively high run rates with minimal equipment downtime.

While the best modes for carrying out the disclosure have been described in detail, those familiar with the art to which this disclosure relates will recognize various alternative designs and embodiments for practicing the disclosure within the scope of the appended claims.

What is claimed is:

1. A method of forming a self-cleaning film system, the method comprising:
depositing a fluorinated material selected from the group consisting of fluorinated organic compounds, fluorinated inorganic compounds, and combinations thereof onto a substrate to form a first layer;
removing a plurality of portions of the first layer to define a plurality of cavities in the first layer and form a plurality of projections that protrude from the substrate;
depositing a photocatalytic material onto the plurality of projections and into the plurality of cavities to form a second layer comprising:
a plurality of bonded portions disposed in the plurality of cavities and in contact with the substrate; and
a non-bonded portion disposed on the plurality of projections and spaced apart from the substrate;
after depositing the photocatalytic material, removing the non-bonded portion; and after removing the non-bonded portion, removing the plurality of projections to thereby form the self-cleaning film system,
wherein the self-cleaning film system includes a film disposed on the substrate and including the plurality of bonded portions disposed within the fluorinated material and spaced apart from one another such that the plurality of bonded portions abut, are surrounded by, and are not covered by the fluorinated material.

2. The method of claim 1, wherein depositing the photocatalytic material includes chemically bonding the photocatalytic material to the substrate within the plurality of cavities.

3. The method of claim 1, further including, after removing the plurality of projections, redepositing the fluorinated material.

4. The method of claim 3, wherein redepositing includes wiping the fluorinated material onto the substrate so that the fluorinated material contacts the plurality of bonded portions.

5. The method of claim 1, further including contacting at least one of the plurality of bonded portions and squalene.

6. The method of claim 5, further including oxidizing the squalene.

7. The method of claim 5, further including vaporizing the squalene.

8. A method of forming a self-cleaning film system, the method comprising:
depositing a photocatalytic material onto a substrate to form a first layer;
disposing a photoresist onto the first layer;
after disposing the photoresist, exposing the photoresist to light so that the photoresist has a developed portion and an undeveloped portion;
removing the undeveloped portion so that the developed portion protrudes from the first layer, wherein removing the undeveloped portion includes covering a protected portion of the first layer and not covering an unprotected portion of the first layer;
after removing the undeveloped portion, removing the unprotected portion and depositing a fluorinated material selected from the group consisting of fluorinated organic compounds, fluorinated inorganic compounds, and combinations thereof onto the first layer to surround and contact the protected portion; and
after depositing the fluorinated material, removing the developed portion to thereby form the self-cleaning film system;
wherein the self-cleaning film system includes a film disposed on the substrate and including a plurality of bonded portions formed from the photocatalytic material, disposed within the fluorinated material, and spaced apart from one another such that the plurality of bonded portions abut, are surrounded by, and are not covered by the fluorinated material.

9. The method of claim 8, wherein depositing the fluorinated material includes plasma-enhanced chemical vapor depositing fluorinated diamond-like carbon having an anatase form onto the substrate.

10. The method of claim 8, further including, after depositing the fluorinated material, removing the developed portion.

11. The method of claim 10, wherein removing the developed portion includes excimer laser annealing the developed portion and the fluorinated material.

12. The method of claim 10, wherein removing the developed portion includes ion beam annealing the developed portion and the fluorinated material.

13. A method of forming a self-cleaning film system, the method comprising:
continuously depositing an anti-reflection film onto a substrate fed from a first roll;
disposing a fluorinated material selected from the group consisting of fluorinated organic compounds, fluorinated inorganic compounds, and combinations thereof onto the anti-reflection film;
ink jet printing a photoresist onto the fluorinated material to form a first precursor;
ion etching a first portion of the photoresist and the fluorinated material with a $SF_6$-$O_2$ plasma composition to form an exposed portion of the first precursor;
depositing a photocatalytic material onto the exposed portion to form a second precursor;
dissolving a second portion of the photoresist to form a workpiece; and
continuously rolling the workpiece onto a second roll to thereby form the self-cleaning film system.

14. The method of claim 13, wherein continuously depositing the anti-reflection film includes:
magnetron sputtering a first sheet formed from titanium dioxide;
magnetron sputtering a second sheet formed from silicon dioxide onto the first sheet; and
magnetron sputtering a third sheet formed from titanium dioxide onto the second sheet.

15. The method of claim 13, wherein depositing the photocatalytic material includes depositing titanium dioxide having an anatase form.

* * * * *